(12) United States Patent
Lee

(10) Patent No.: US 7,435,630 B2
(45) Date of Patent: Oct. 14, 2008

(54) ACTIVE MATRIX TYPE ORGANIC LIGHT EMITTING DIODE DEVICE AND FABRICATION METHOD THEREOF

(75) Inventor: Kyung-Eon Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 226 days.

(21) Appl. No.: 11/258,956

(22) Filed: Oct. 27, 2005

(65) Prior Publication Data
US 2006/0091399 A1    May 4, 2006

(30) Foreign Application Priority Data
Oct. 29, 2004    (KR) ...................... 10-2004-0087479

(51) Int. Cl.
*H01L 21/00* (2006.01)
*H01L 21/84* (2006.01)
(52) U.S. Cl. ........................... 438/149; 438/48; 438/66; 438/82; 438/99
(58) Field of Classification Search .................. 257/59, 257/71, 72, 75, 290–292, 443, 444, E27.131–E27.133; 438/48, 66, 67, 73, 80, 82, 99, 128, 149, 438/151
See application file for complete search history.

(56) References Cited

U.S. PATENT DOCUMENTS 6,801,279 B2 * 10/2004 Jang et al. .................... 349/113

FOREIGN PATENT DOCUMENTS

KR    10-2004-0019186 A    3/2004

* cited by examiner

*Primary Examiner*—Hung Vu
(74) *Attorney, Agent, or Firm*—Birch, Stewart, Kolasch & Birch, LLP

(57) ABSTRACT

An active matrix type organic light emitting diode (AMOLED) device and its fabrication method are discussed. In one embodiment, an OLED device includes an EL configured to emit light, a driving TFT configured to control the EL, a storage capacitor coupled to the driving TFT, and at least one insulation layer configured to insulate at least one of the EL, the driving TFT and the storage capacitor, and including a plurality of recesses formed on a surface of the at least one insulation layer.

10 Claims, 8 Drawing Sheets

ACTIVE MATRIX TYPE ORGANIC LIGHT EMITTING DIODE DEVICE AND FABRICATION METHOD THEREOF

This Nonprovisional application claims priority under 35 U.S.C. § 119 on Patent Application No. 10-2004-0087479 filed in the Republic of Korea on Oct. 29, 2004, the entire contents of which are hereby incorporated by reference.

BACKGROUND OF THE INVENTION

1. Field of the Invention

The present invention relates to an active matrix type organic light emitting diode (AMOLED) device and, more particularly, to an AMOLED device using a polysilicon thin film transistor (TFT) capable of removing a moire phenomenon and its fabrication method.

2. Description of the Related Art

Recently, a liquid crystal display (LCD) device is widely preferred to be used as a flat panel display due to its light weight and low power consumption. However, since the LCD device is a passive device, not a self-light emitting device, and because of its technical limitations with respect to brightness, contrast, a viewing angle and enlargement of screen, there have been efforts to develop a new flat panel display that can overcome such shortcomings of the LCD device.

An OLED device, one of new flat panel displays, is a self-light emitting type display device having an excellent viewing angle and contrast compared with the conventional LCD device, and because it does not need a backlight, the OLED device is advantageous in terms of power consumption.

In addition, the OLED device also has such advantages that it can be driven at a low DC voltage, has a fast response speed, is resistant to an external impact as being entirely solid, has a wide range of usage temperature, and is low in its fabrication cost.

Especially, as for a fabrication process of the OLED device, unlike the LCD device or a PDP (Plasma Display Panel), the OLED device needs only a deposition and encapsulation equipment, thereby considerably simplifying its fabrication process.

When the OLED device having TFTs is driven by an active matrix method, at each pixel, the same luminance can be obtained by applying a relatively low current, so the OLED device has low power consumption and high resolution and its product can have a large size.

The basic structure and operational characteristics of the active matrix type organic LED (AMOLED) device according to a related art will now be described with reference to FIG. 1.

With reference to FIG. 1, a scan line (gate line) (G) is formed spaced apart in a first direction, and a signal line (data line) (D) and a power supply line (P) are formed in a second direction and crossing the scan line, thereby forming a pixel region.

A switching TFT (TR1), an addressing element, is connected at a crossing of the scan line (G) and the signal line (D), and a storage capacitor (Cst) is connected with the switching TFT (TRI) and the power supply line (P). A driving TFT (TR2), a current source element, is connected with the storage capacitor (Cst) and the power supply line (P), and an EL (electroluminescent) is connected with the driving TFT (TR2).

Herein, the switching TFT (TR1) includes a gate electrode (G1) connected with the scan line (G), a source electrode (S1) connected to the signal line (D) and supplying a data signal, and a drain electrode (D1) connected with a gate electrode (G2) of the driving TFT (TR2), and switches the EL.

The driving TFT (TR2) includes the gate electrode (G2) connected with the drain electrode (D1) of the switching TFT (TR1), a drain electrode (D2) connected with an anode electrode of the EL, and a source electrode (S2) connected with the power line (P) and a ground line.

One electrode of the storage capacitor (Cst) is commonly connected with the drain electrode (D1) of the switching TFT (TR1) and the gate electrode (G2) of the driving TFT (TR2), and the other electrode of the storage capacitor (Cst) is connected with the source electrode (S2) of the driving TFT (TR2) and the power line (P).

The EL includes the anode electrode connected with the drain electrode (D2) of the driving TFT (TR2), a cathode electrode connected with a ground line, and an EL layer formed between the cathode electrode and the anode electrode. The EL layer includes a hole transfer layer, a light emitting layer and an electron transfer layer.

In the above constructed AMOLED device, a current is supplied to the EL through the driving TFT. In this respect, because an existing amorphous silicon TFT has a low carrier mobility, recently, a polysilicon TFT having a carrier mobility better than the amorphous silicon TFT is preferred to be used.

Also, in order to properly exhibit a fine color change, a precise gray scale capability is essential for a display. In the above-mentioned OLED device, an amount of current passing through the EL is controlled. In an active driving method, an amount of current passing through the driving TFT which supplies a current to the EL is controlled to differ an amount of light emission of the OLED device to thereby display the gray scale.

A method for fabricating the general AMOLED as described above will be explained with reference to FIG. 2 according to a related art.

With reference to FIG. 2, a buffer layer 13 is formed on an insulation substrate 11 by using an insulation material such as an oxide film, and a semiconductor layer 15 made of a polysilicon film (poly-Si) is formed on the buffer layer 13 by using a first mask (not shown).

Next, a gate insulation film 17 is formed on the entire surface of the insulation substrate 11 including the semiconductor layer 15, on which a gate electrode material is deposited and then patterned by using a second mask (not shown) to form a gate electrode 19, a lower electrode 21 and a gate line (not shown) simultaneously together.

Subsequently, source electrode region/drain electrode region 15a and 15b are formed by injecting an impurity with certain conductivity, for example, a p-type impurity ion, into the semiconductor layer 15 by using the gate electrode 19 as a mask.

And then, a first interlayer insulation film 23 is deposited on the gate insulation film 17 including the gate electrode 19, on which a conductive material such as a metal is deposited, which is then selectively patterned by using a third mask (not shown) to form a cathode electrode (namely, a pixel electrode) 25 of the EL and an upper electrode 27 of the capacitor at an upper portion of the lower electrode 21 of the storage capacitor Cst.

Subsequently, a second interlayer insulation film 29 is formed on the entire surface including the cathode electrode 25 and the upper electrode 27 of the capacitor, and the second interlayer insulation film 29 and the first interlayer insulation film 23 are selectively patterned by using a fourth mask (not shown) to form first to fifth contact holes 31a~31e exposing the source/drain regions 15a and 15b and the upper and lower electrodes 27 and 21 of the capacitor Cst.

And then, a conductive material such as a metal is deposited entirely on the substrate including the first to fifth contact holes 31a~31e and then selectively patterned by using a fifth mask (not shown) to form a first conductive layer pattern 33 for connecting the drain electrode region 15a and the EL, a second conductive layer pattern 35 for connecting the source electrode region 15b and the upper electrode 27 of the capacitor (namely, a power line) and a third conductive layer pattern 37 for connecting the lower electrode 21 of the capacitor, the drain electrode of the first TFT (TR1) and the gate electrode of the second TFT (TR2).

Thereafter, a passivation film 39 is deposited to be thick on the entire surface of the substrate by using an insulation material such as an oxide film, and then, the passivation film 39 and the second interlayer insulation film 29 are selectively patterned by using a sixth mask (not shown) to form an opening 41 exposing the cathode electrode 25.

Subsequently, an EL layer 43, an organic light emitting layer, is formed on the cathode electrode 25 below the opening portion 41, and an anode electrode 45 is formed on the EL layer 43, to fabricate the EL. This results in the related art AMOLED device.

However, according to the above-discussed AMOLED device and its fabrication method according to the related art, after the AMOLED is crystallized by an SLS (Sequential Lateral Solidification), the fabrication process of a lower plate is completed, and then, a single color organic light emitting layer is deposited to perform a DC testing. In this case, as shown in FIG. 3, moiré in the pattern of a comb-teeth is generated, which is a problem.

When the amorphous silicon or the above-described existing polysilicon TFT as the driving TFT (TR2) is used, such a moiré phenomenon does not occur. However, when a 2-shot process leading to excellent productivity is used, such moiré phenomenon occurs.

A major cause of the moiré phenomenon is an interference phenomenon of light. Namely, mutual interference is presumed to work between a regular metal pattern of a pixel and another regular optical layer. The optical layer has different optical characteristics from that of an insulation film and the polysilicon film which undergo a high temperature during a crystallization process.

Such moiré phenomenon affects the characteristics of picture quality so that even a gray is changed, and the teeth of a comb in the moiré phenomenon does not disappear but remains continuously.

The moiré phenomenon causing such problems will be described in more detail.

In order to understand the moiré phenomenon, a beat phenomenon of a sound wave must be first understood.

The beat phenomenon refers to a phenomenon that two waves each with a similar frequency affect each other so a width of a frequency is changed at certain periods according to a difference between the two frequencies of the waves. Waves each with a similar frequency are offset or reinforced by the other frequency to form a certain period by which a wave becomes big or annihilated.

The moiré phenomenon corresponds to a visually generated beat phenomenon. When objects have a certain interval therebetween, an interference fringe is generated between the objects. Thus, in a liquid crystal display panel or in the OLED device, a gate line, a data line, a grain boundary, or the like, forms the moiré pattern on a screen because of a diffractive slit light interference. In this case, the moiré pattern can form a rainbow-shaped grating or the comb-teeth grating.

The moiré phenomenon must be solved with respect to an image display device such as the liquid crystal display (LCD) device, and is quite problematic in case of an EL image display device using the EL as a light emitting device.

An image display device using the EL as a light emitting device has a similarity to the LCD device in that it includes a plurality of gate lines arranged in parallel and a plurality of data lines perpendicularly crossing over the gate lines, where a unit pixel is defined by the crossing of the gate lines and the data lines, and a TFT is provided as a switching device at each unit pixel.

Meanwhile, the EL image display device is different from the LCD device in that (1) it uses the EL which emits light by itself as a light source so it does not require a backlight assembly (a light source of the LCD device), (2) it does not require a liquid crystal layer used in the LCD device because it controls the amount of light emission of the EL by controlling a voltage to display color, and (3) it does not require a color filter layer used in the LCD device for displaying natural color because the EL itself has red, green and blue colors.

Both the EL image display device and the LCD device do have the moiré problem. However, the moiré problem is more severe in the EL that does not have a polarization plate as in the LCD device. Therefore, the moiré phenomenon must be solved for the EL image display device.

SUMMARY OF THE INVENTION

Therefore, one object of the present invention is to provide an active matrix type organic light emitting diode (AMOLED) device capable of removing a moiré phenomenon caused by a light interference by making an insulation film of a pixel to have an irregular pattern, and its fabrication method.

Another object of the present invention is to provide an active matrix type organic light emitting diode (AMOLED) device capable of enhancing characteristics of a screen by removing a moiré phenomenon when the AMOLED device is crystallized, and its fabrication method.

Another object of the present invention is to provide an EL image display device and its fabrication method, which overcome the problems and limitations associated with the related art.

To achieve these and other advantages and in accordance with the purpose of the present invention, as embodied and broadly described herein, in one aspect there is provided an active matrix type organic light emitting diode (AMOLED) device comprising a buffer layer formed on an insulation substrate, a semiconductor layer formed on the buffer layer and having drain/source electrodes, a gate insulation film formed on the buffer layer including the semiconductor layer, a gate electrode and a capacitor lower electrode formed on the gate insulation film, a first interlayer insulation film formed on the gate electrode and the capacitor lower electrode, a cathode electrode of an EL and a capacitor upper electrode formed on the first interlayer insulation film, a second interlayer insulation film formed on the resulting structure and having contact holes exposing portions of the cathode electrode, the drain electrode, the source electrode, the capacitor upper electrode and the capacitor lower electrode, first and second conductive layer patterns formed on the second interlayer insulation film, the first conductive layer pattern connecting the cathode electrode and the drain electrode, the second conductive layer pattern connecting the source electrode and the capacitor upper electrode, a passivation layer formed on the resulting structure and having an opening exposing a portion of the cathode electrode, an EL layer formed inside the opening; and an anode electrode formed on the EL layer, wherein a plurality of recesses are formed on a surface of at least one of the buffer layer, the gate insulation film, the first interlayer insulation film, the second interlayer insulation film and the passivation layer.

In another aspect of the present invention, there is a method for fabricating an active matrix type organic light emitting diode (AMOLED) device, the method comprising forming a buffer layer on an insulation substrate, forming a semiconductor layer on the buffer layer, forming a gate insulation film on the semiconductor layer, forming a gate electrode and a capacitor lower electrode on the gate insulation film and forming a drain electrode region and a source electrode region at the semiconductor layer below both sides of the gate electrode, forming a first interlayer insulation film on a surface of the resulting structure, forming a cathode electrode of an EL and a capacitor upper electrode on the first interlayer insulation film, forming a second interlayer insulation film on a surface of the resulting structure, forming a plurality of contact holes exposing portions of the cathode electrode, the drain electrode region, the source electrode region, the capacitor upper electrode and the capacitor lower electrode through at least one etching process, forming a first conductive layer pattern connecting the cathode electrode and the drain electrode region, and a second conductive layer pattern connecting the source electrode region and the capacitor upper electrode through the plurality of contact holes, forming a passivation film on a surface of the resulting structure and patterning the passivation film to form an opening exposing a portion of the cathode electrode, forming an EL layer inside the opening and forming an anode electrode thereon, and forming a plurality of recesses on a surface of at least one of the buffer layer, the gate insulation layer, the first interlayer insulation film, the second interlayer insulation film and the passivation film.

In another aspect of the present invention, there is an organic light emitting diode (OLED) device comprising an EL configured to emit light, a driving TFT configured to control the EL, a storage capacitor coupled to the driving TFT; and at least one insulation layer configured to insulate at least one of the EL, the driving TFT and the storage capacitor, and including a plurality of recesses formed on a surface of the at least one insulation layer.

In another aspect of the present invention, there is a method of forming an organic light emitting diode (OLED) device, the method comprising forming an EL configured to emit light, forming a driving TFT configured to control the EL, forming a storage capacitor coupled to the driving TFT; and forming at least one insulation layer configured to insulate at least one of the EL, the driving TFT and the storage capacitor, wherein the at least one insulation layer includes a plurality of recesses formed on a surface of the at least one insulation layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
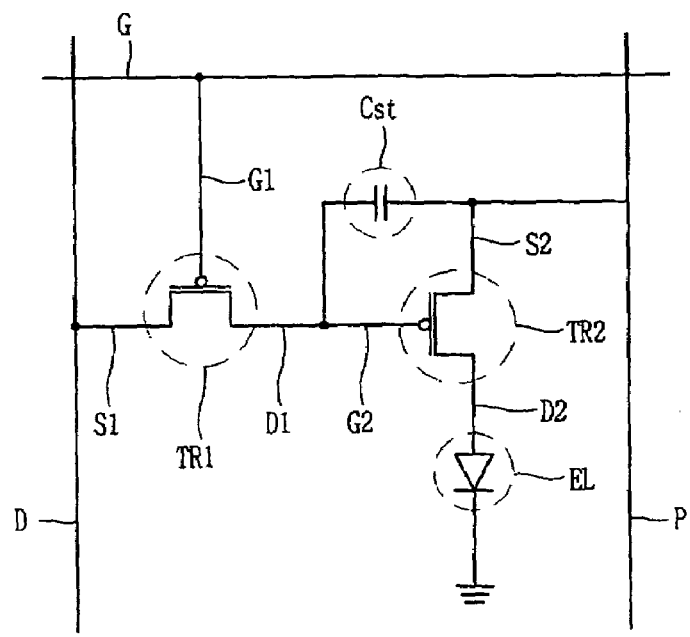
FIG. 1 illustrates a basic pixel structure of a general active matrix type organic light emitting diode (AMOLED) device.
Figure 2:
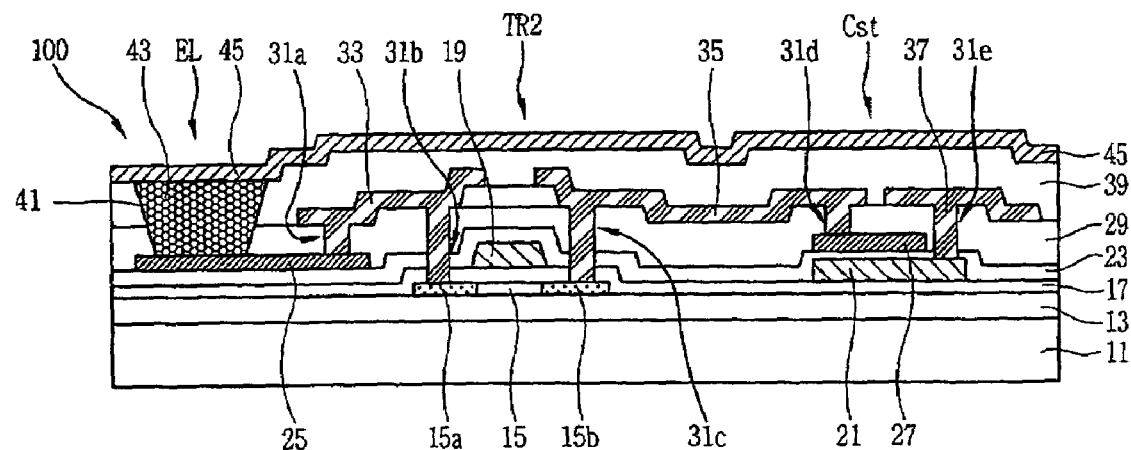
FIG. 2 is a sectional view of an AMOLED device in accordance with a related art.
Figure 3:
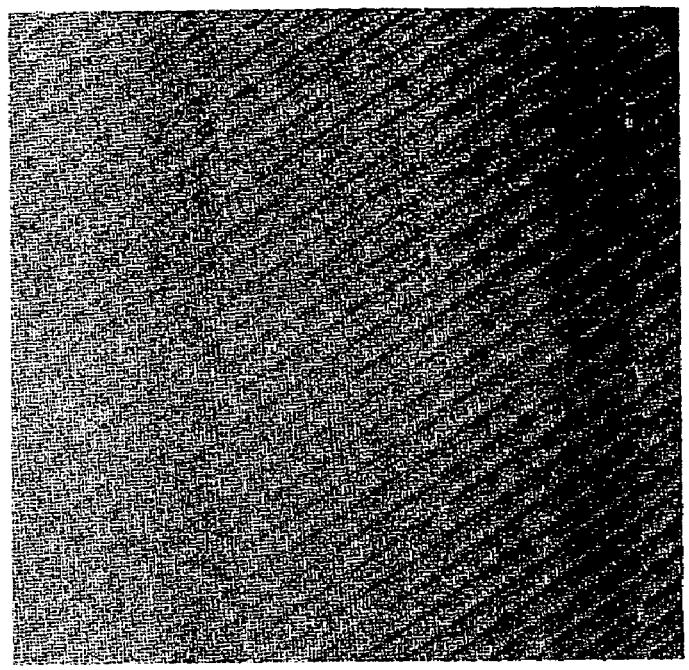
FIG. 3 is a photo showing a moiré phenomenon of various angles generated after the AMOLED device is driven in accordance with the related art.
Figure 4:
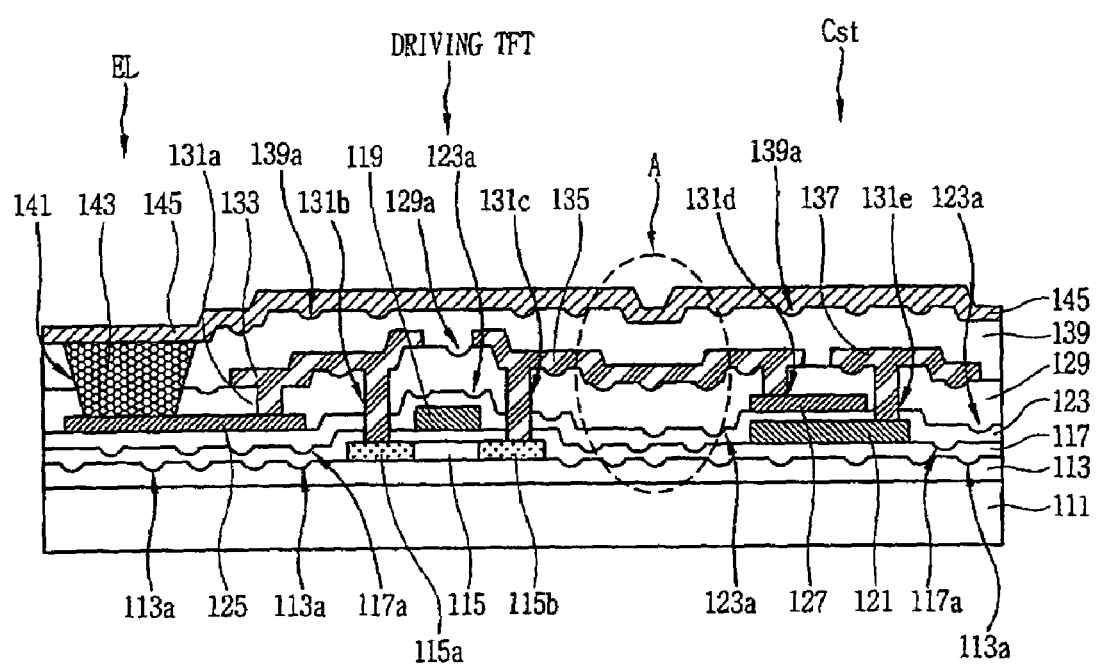
FIG. 4 is a sectional view of an AMOLED device according to an embodiment of the present invention.
Figure 5:
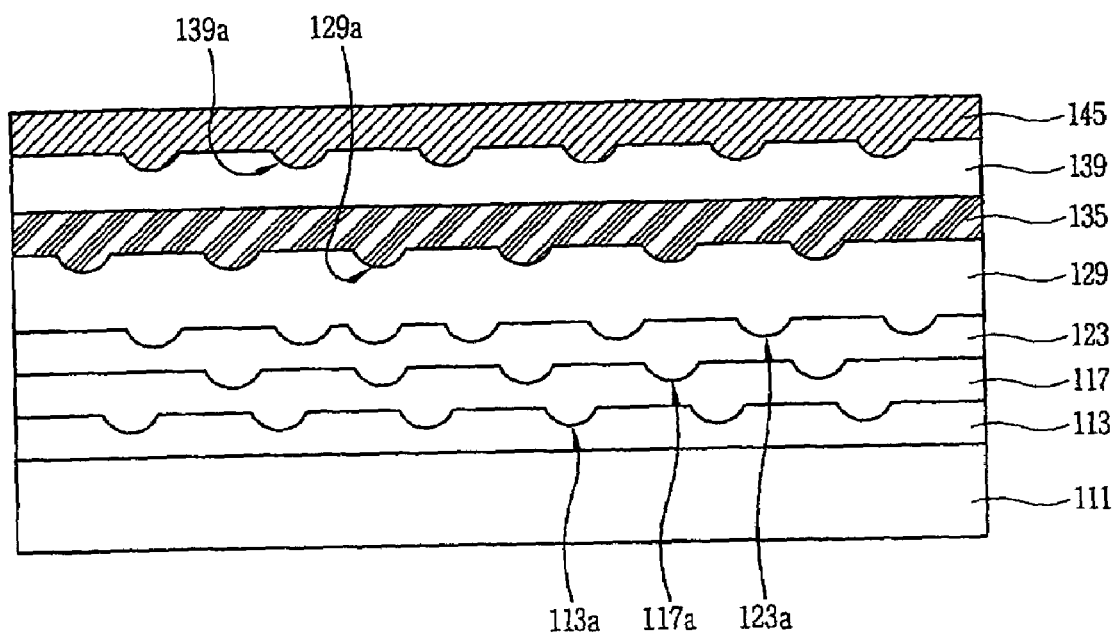
FIG. 5 is an enlarged sectional view of a portion 'A' in FIG. 4, showing a stacked state of insulation films with a plurality of recesses formed therein according to an embodiment of the present invention.
Figure 6:
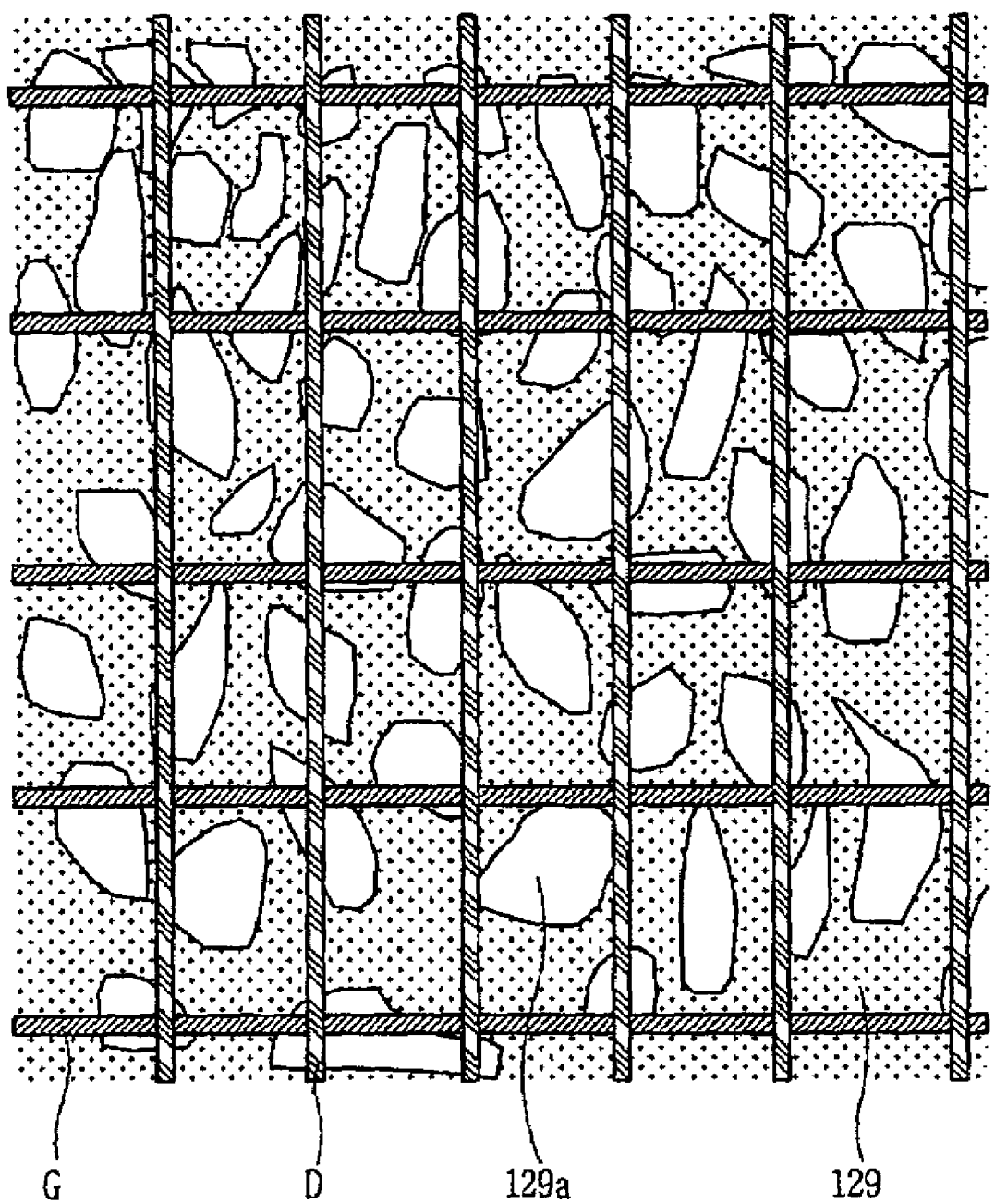
FIG. 6 is a plan view showing an example of a plurality of irregularly-patterned recesses formed on a surface of an insulation film, among insulation films formed during a fabrication process of the AMOLED device, in accordance with the present invention.

FIG. 4 is a sectional view of an AMOLED device in accordance with the present invention, FIG. 5 is an enlarged view of the portion 'A' in FIG. 4, showing a stacked state of insulation films with a plurality of recesses formed therein, and FIG. 6 is a plan view showing an example of a plurality of irregularly-patterned recesses formed on a surface of an insulation film during a fabrication process of the AMOLED device. Although FIG. 4 focuses on a unit pixel including a switch TFT, a storage capacitor Cst, a driving TFT and an EL, all operatively coupled, the AMOLED device has a plurality of such unit pixels in a known matrix arrangement.

As shown in FIGS. 4 and 5, the AMOLED device in accordance with the present invention is constructed such that a buffer layer 113 with a plurality of first recesses 113a formed thereon is formed on an insulation substrate 110 and a semiconductor layer 115 made of polysilicon with a drain electrode region 115b and a source electrode region 115a formed at its both sides is formed, making a channel layer, on the buffer layer 113.

A gate insulation film 117 with a plurality of second recesses 117a formed thereon is formed on the entire surface of the substrate including the semiconductor layer 115, A gate electrode 119 is formed on the gate insulation film 117 corresponding to the semiconductor layer 115 between the drain electrode region 115b and the source electrode region 115a, and a lower electrode 121 of a storage capacitor Cst is formed on the gate insulation film 117 of the storage capacitor region.

A first interlayer insulation film 123 with a plurality of third recesses 123a formed thereon is formed entirely on the substrate including the gate electrode 119, and a cathode electrode 125 of an EL and an upper electrode 127 of the capacitor Cst are respectively formed on the first interlayer insulation film 123 of the EL region and the storage capacitor region.

A second interlayer insulation film 129 with a plurality of fourth recesses 129a formed thereon and having first to fifth contact holes 131a~131e exposing the cathode electrode 125, the drain electrode region 115b, the source electrode region 115a, the upper electrode 127 of the capacitor Cst and the lower electrode 121 of the capacitor Cst is formed on the entire surface of the substrate.

On the second interlayer insulation film 129, there are formed a first conductive layer pattern 133 connecting the cathode electrode 125 and the drain electrode region 115b through the first to the fifth contact holes 131a~131e, a second conductive layer pattern 135 connecting the source electrode region 115a and the upper electrode 127 of the capacitor Cst (namely, a power line) and a third conductive layer pattern 137 connected with the lower electrode 121, the drain electrode region of a switching TFT (connected directly to the gate and data lines) and a gate electrode of the driving TFT (connected directly to the EL).

A passivation film 139 made of an insulation material and having an opening 141 exposing the cathode electrode 125 of the EL is formed. Also, a plurality of fifth recesses 139a are formed at the passivation film 139.

An EL layer 143 is formed at the opening 141, and an anode electrode 145 of the EL is formed on the EL layer 143.

With reference to FIG. 5 showing an enlarged view of the portion of 'A' in FIG. 4, in the AMOLED of the present invention, the plurality of recesses 113a, 117a, 123a, 129a and 139a are irregularly formed on the surfaces of the buffer layer 113 made of an insulation material, the gate insulation film 117, the first interlayer insulation film 123, the second interlayer insulation film 129 and the passivation film 139, and thus eliminate a regular optical path difference. That is, these recesses have irregular patterns, shapes, and/or sizes (see an example in FIG. 6). Accordingly, no interference occurs with a regular metal pattern of a pixel, and thus, the moire phenomenon does not and cannot occur and is effectively addressed.

With reference to FIG. 6 showing an example of the recesses, among the plurality of layers made of an insulation material, the plurality of recesses 129a are irregularly formed on the surface of an insulation film (the second interlayer insulation film 129) existing at a pixel region where the gate line (G) and the data line (D) cross over. In this respect, a ratio of a non-etched area (area where no recess is formed) and the area of the plurality of recesses 129a formed by being etched is within about 1:1 range.

Unlike this embodiment in which the plurality of recesses are formed on all the layers made of an insulation material, in a different embodiment of the present invention, a plurality of recesses can be formed on a surface of at least one of the layers made of the insulation material. For instance, one or more of the layers 113, 117, 123, 129, 139, etc. can have the irregularly patterned recesses.

A method for fabricating the AMOLED device constructed as described above will be explained according to the present invention with reference to the accompanying drawings.

FIGS. 7a to 7h are views showing the sequential processes of a method for fabricating the AMOLED device of FIGS. 4-6 in accordance with the present invention.

Figure 7A:
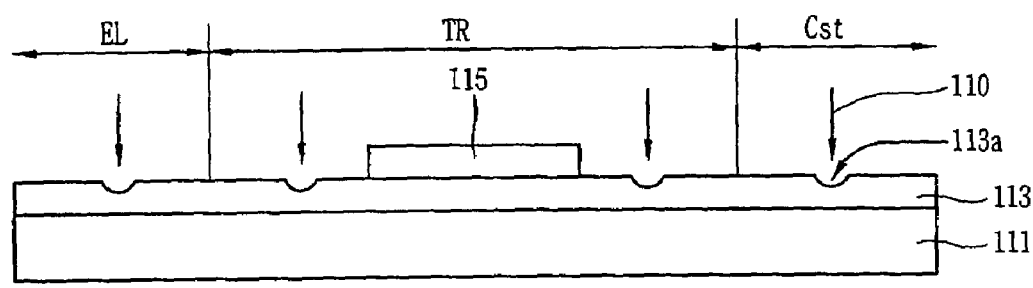
FIGS. 7a to 7h are views showing sequential processes of a method for fabricating the AMOLED device in accordance with the present invention.

As shown in FIG. 7a, according to the method for fabricating the AMOLED device, the buffer layer 113 is formed on the insulation substrate 110, a polysilicon layer is deposited on the buffer layer 113, and the polysilicon layer is selectively etched through an etching process using a first mask to form a semiconductor layer 15 made of a polysilicon film.

And then, the plurality of first recesses 113a are irregularly formed on the surface of the buffer layer 113 through an etching process 110. At this time, the first recesses 113a can be formed during an etching process of the semiconductor layer 115 or can be formed through a separate masking process.

Figure 7B:
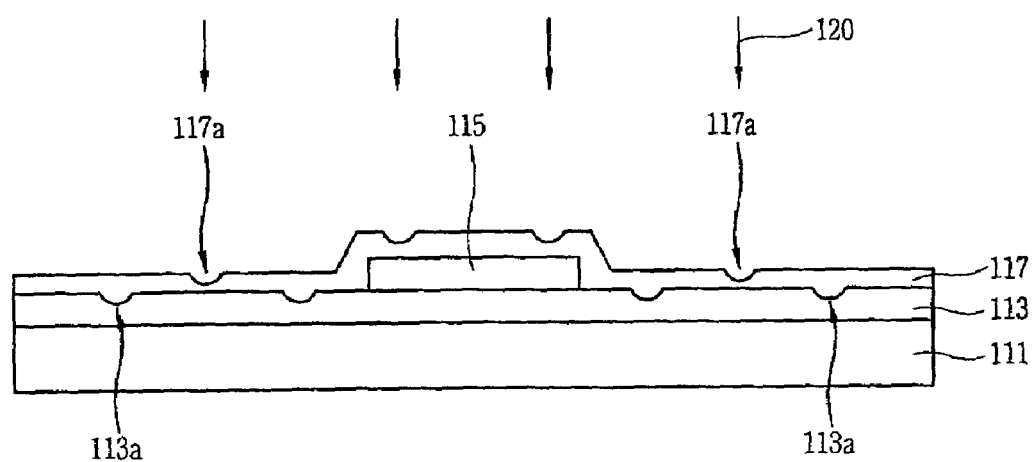

Subsequently, as shown in FIG. 7b, the gate insulation film 117 is formed on the entire surface of the substrate including the semiconductor layer 115, and then, the plurality of second recesses 117a are irregularly formed on the surface of the gate insulation film 117 through an etching process 120. In this case, the second recesses 117a are formed at locations which do not correspond to or match the locations of the first recesses 113a formed on the surface of the buffer layer 113. In addition, the etching process for forming the first recesses 117a can be performed through the etching process or through a separate masking process, or may not be performed according to circumstances.

Figure 7C:
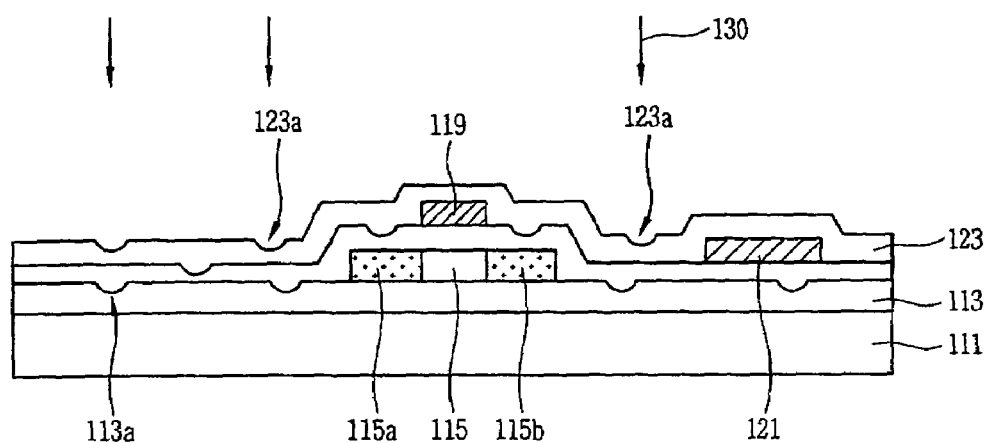

And then, as shown in FIG. 7c, a gate electrode material can be deposited on the gate insulation film 117 and then selectively patterned by using a second mask to form the gate electrode 119. At this time, the lower electrode 121 of the capacitor Cst and a gate line are also formed together when the gate electrode 119 is formed.

Subsequently, an impurity having a certain conductivity type, for example, a p-type impurity, is ion-injected into the semiconductor layer 115 by using the gate electrode 119 as a mask to form high density source electrode region/drain electrode region 115a and 115b.

And then, the first interlayer insulation film 123 is deposited on the gate insulation film 117 including the gate electrode 119, and the plurality of third recesses 123a are irregularly formed on the surface of the first interlayer insulation film 123 through an etching process 130. In this case, the third recesses 123a are formed at locations which do not correspond to or match the locations of the second recesses 123a formed on the surface of the gate insulation film 123. In addition, the etching process for forming the third recesses 123a can be performed by using separate masking processes or may not be performed according to circumstances.

Figure 7D:
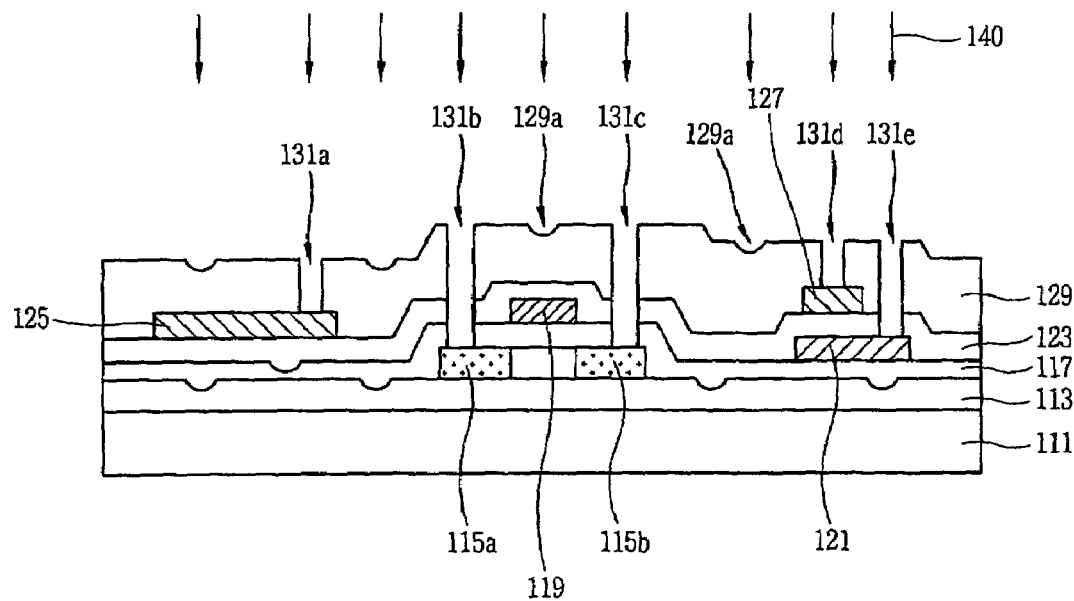

Thereafter, as shown in FIG. 7d, a conductive material such as a metal is deposited on the entire surface of the substrate and then selectively patterned by using a third mask to form a cathode electrode (namely, a pixel electrode) 125 of the EL and an upper electrode 127 of the storage capacitor Cst at an upper side of the lower electrode 121 of the storage capacitor Cst.

And then, the second interlayer insulation film 129 is formed on the entire surface of the substrate including the cathode electrode 125 of the EL and the upper electrode 127 of the capacitor, and the second and first interlayer insulation films 129 and 123 are selectively patterned by using a fourth mask to form the first to fifth contact holes 131a~131e exposing portions of the cathode electrode 125, the source electrode region/drain electrode region 115a and 115b, and the upper and lower electrodes 127 and 121 of the capacitor.

At this time, the plurality of fourth recesses 129a can be irregularly formed together on the surface of the second interlayer insulation film 129 during an etching process 140 for forming the first to fifth contact holes 131a~131e, namely, when the second interlayer insulation film 129 is etched, or can be formed by adding a separate etching process. The fourth recesses 129a are formed at locations which do not correspond to or match the third recesses 123a formed on the first interlayer insulation film 123. In the alternative, the process for forming the fourth recesses 129a may not be performed at all according to circumstances, so as to not form the fourth recesses 129a.

Figure 7E:
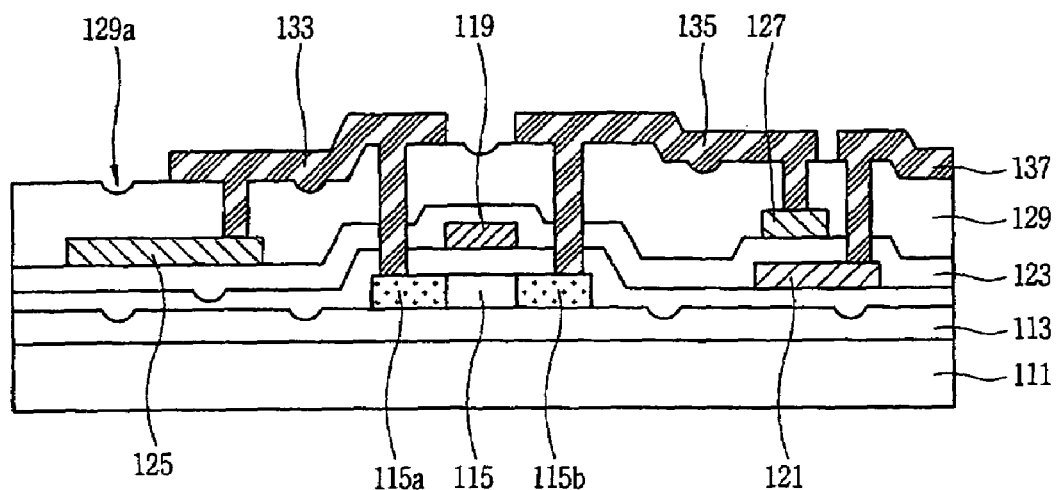

Subsequently, as shown in FIG. 7e, a conductive material such as a metal is deposited on the entire surface of the substrate including the first to fifth contact holes 131a~131e, and then, the conductive material layer is selectively patterned by using a fifth mask to form the first conductive layer pattern 133 connecting the cathode electrode 125 and the drain electrode region 115b, the second conductive layer pattern 135 connecting the source electrode region 115a and the upper electrode 127 of the capacitor, namely, the power line, and the third conductive layer pattern 137 connecting the lower electrode 121 of the capacitor, the drain electrode of the first TFT and the gate electrode of the second TFT.

Figure 7F:
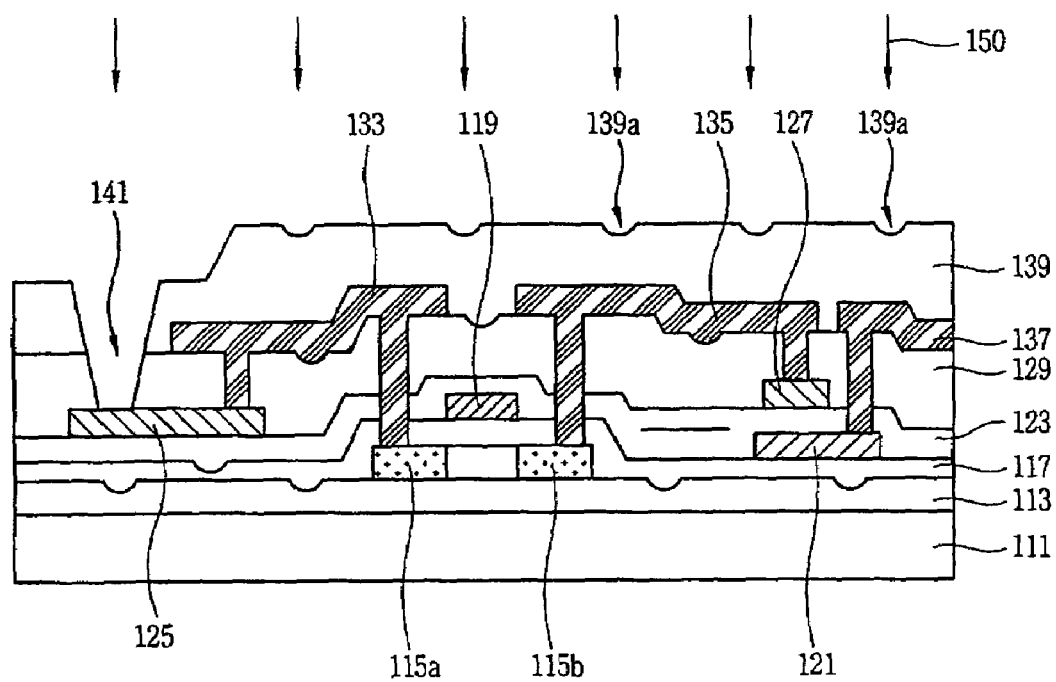

Thereafter, as shown in FIG. 7f, the passivation film 139 made of an insulation material is deposited to be thick on the entire surface of the substrate, and then, the passivation film 139 and the second interlayer insulation film 129 are selectively patterned by using a sixth mask to form the opening 141 exposing the cathode electrode 125. At this time, the plurality of fifth recesses 139a can be irregularly formed together on the surface during an etching process 150 for forming the opening 141 or by adding a separate etching process. In addition, the fifth recesses 139a are formed at locations which do not correspond to or match the locations of the fourth recesses 129a formed on the surface of the second interlayer insulation film 129. In the alternative, the process of forming the fifth recesses 139a may not be performed according to circumstances.

Figure 7G:
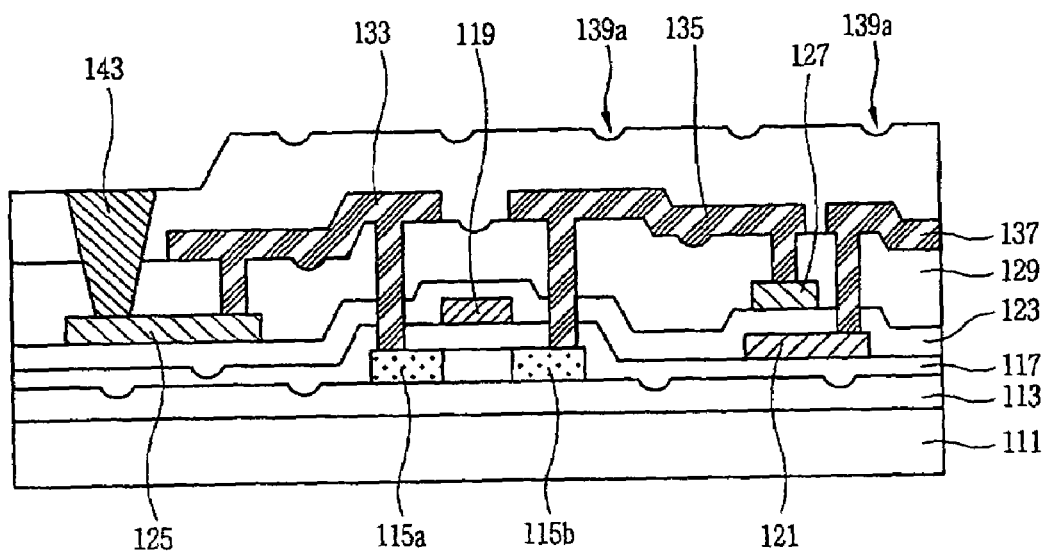
Figure 7H:
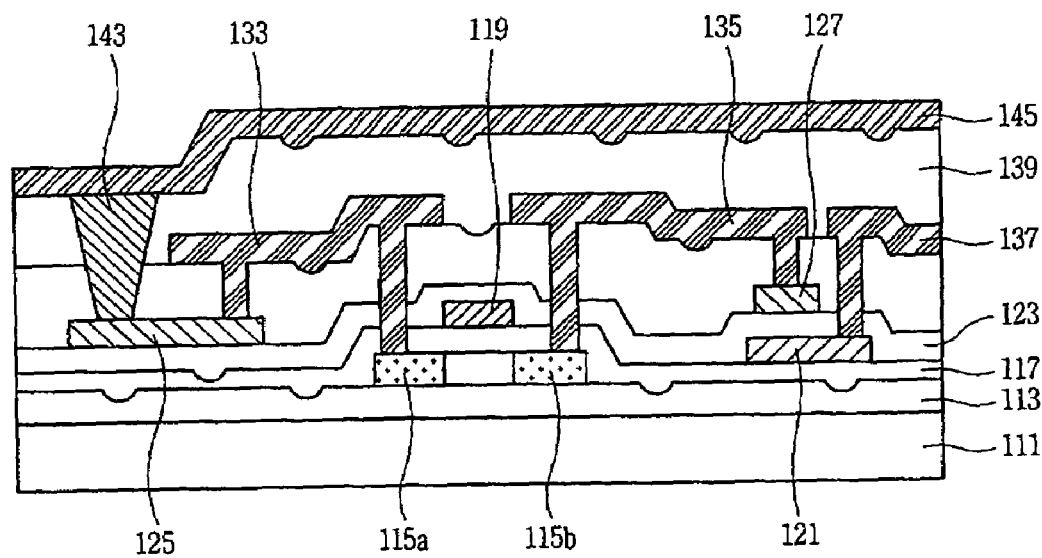

And then, as shown in FIGS. 7g and 7h, the EL layer 143 is formed on the cathode electrode 125 inside the opening 141, on which the anode electrode 145 is formed to fabricate the AMOLED device.

As mentioned above, because the plurality of recesses are irregularly formed on each insulation layer made of an insulation material used for the AMOLED device, or because the plurality of recesses are irregularly formed on a surface of at least one of the layers made of an insulation material, there is no interference between the layer(s) with the irregular recesses and the regular metal pattern of pixels. Thus, the moiré phenomenon does not occur. That is, in the process of forming the irregular patterns, namely, the recesses, on the surface of the insulation film, the insulation film is partially etched through the etching process so that a non-etched region (no recess) and an etched region (recess) can be formed in an irregular form, shape, size, etc. on the entire pixels. In this case, as shown in FIG. 6, the plurality of irregular recesses are formed such that a ratio of the area of a non-etched portion and an area of the etched portion can be about 1:1.

Also, in other embodiment(s) of the present invention, the etching process of the insulation film having the irregular recess patterns can be added as a separate process, or the irregular patterns can be additionally formed in the process of forming a contact hole in the insulation film. Also, the recesses can be formed using mask(s) or through a double exposure process.

As so far described, the AMOLED device and its fabrication method in accordance with the present invention have many advantages.

By forming the irregular patterns, e.g., the irregular recess patterns, on the insulation film over several pixels, an optical path difference cannot have regularity. Accordingly, since a different optical layer that can cause an interference with the regular metal patterns of pixels does not exist, the moiré phenomenon cannot occur and the moiré problem is effectively eliminated.

Because the moiré phenomenon does not occur, the characteristics of a screen can be enhanced.

In addition, since the moiré phenomenon does not occur during a crystallization process of the AMOLED device, its productivity can be enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating an active matrix type organic light emitting diode (AMOLED) device, the method comprising:

forming a buffer layer on an insulation substrate;
forming a semiconductor layer on the buffer layer;
forming a gate insulation film on the semiconductor layer;
forming a gate electrode and a capacitor lower electrode on the gate insulation film and forming a drain electrode region and a source electrode region at the semiconductor layer below both sides of the gate electrode;
forming a first interlayer insulation film on a surface of the resulting structure;
forming a cathode electrode and a capacitor upper electrode on the first interlayer insulation film;
forming a second interlayer insulation film on a surface of the resulting structure;
forming a plurality of contact holes exposing portions of the cathode electrode, the drain electrode region, the source electrode region, the capacitor upper electrode and the capacitor lower electrode through at least one etching process;
forming a first conductive layer pattern connecting the cathode electrode and the drain electrode region, and a second conductive layer pattern connecting the source electrode region and the capacitor upper electrode through the plurality of contact holes;
forming a passivation film on a surface of the resulting structure and patterning the passivation film to form an opening exposing a portion of the cathode electrode;
forming an EL layer inside the opening and forming an anode electrode thereon; and
forming a plurality of recesses on a surface of at least one of the buffer layer, the gate insulation layer, the first interlayer insulation film, the second interlayer insulation film and the passivation film, wherein the plurality of recesses are formed such that they are not located at the same correspondence positions of overlapped upper and lower layers.

2. The method of claim 1, wherein the plurality of recesses are irregularly patterned.

3. The method of claim 1, wherein the plurality of recesses are formed on surfaces of the buffer layer, the gate insulation film, the first interlayer insulation film, the second interlayer insulation film and the passivation layer.

4. The method of claim 1, wherein the plurality of recesses have a different size.

5. The method of claim 1, wherein a ratio of the size of an area where the plurality of recesses are formed and the size of an area where no recess is formed is about 1:1.

6. The method of claim 1, wherein, in the step of forming the plurality of recesses, the recesses are formed by using a mask or through a double exposure process.

7. A method of forming an organic light emitting diode (OLED) device, the method comprising:

forming an EL configured to emit light;
forming a driving TFT configured to control the EL;
forming a storage capacitor coupled to the driving TFT; and
forming at least one insulation layer configured to insulate at least one of the EL, the driving TFT and the storage capacitor, wherein the at least one insulation layer includes a plurality of recesses formed on a surface of the at least one insulation layer, wherein in the step of forming the at least one insulation layer, the at least one insulation layer involves a plurality of different insulation layers, each of the insulation layers including a plurality of recesses on a surface of the corresponding insulation layer.

8. The method of claim 7, wherein in the step of forming the at least one insulation layer, the plurality of recesses have irregular shapes and/or sizes.

9. The method of claim 7, wherein in the step of forming the at least one insulation layer, the at least one insulation layer includes at least one of the following:
   a buffer layer on which the EL, the driving TFT and the storage capacitor are formed;
   a gate insulation layer between source/drain electrode regions and a gate electrode of the driving TFT;
   a first interlayer insulation film on the gate electrode of the driving TFT;
   a second interlayer insulation film on the storage capacitor, or
   a passivation film on an electrode of the EL.

10. The method of claim 7, wherein in the step of forming the at least one insulation layer, a ratio of a size of a total area on the at least one insulation layer where the plurality of recesses are formed and a size of a total area on the at least one insulation layer where no recess is formed is about 1:1.

* * * * *